United States Patent
Cheng et al.

(10) Patent No.: US 8,657,181 B2
(45) Date of Patent: Feb. 25, 2014

(54) WEDGE BONDER AND A METHOD OF CLEANING A WEDGE BONDER

(75) Inventors: Chi Wah Cheng, Hong Kong (CN); Man Kit Mui, Hong Kong (CN)

(73) Assignee: ASM Technology Singapore Pte Ltd, Singapore (SG)

( * ) Notice: Subject to any disclaimer, the term of this patent is extended or adjusted under 35 U.S.C. 154(b) by 0 days.

(21) Appl. No.: 13/532,966

(22) Filed: Jun. 26, 2012

(65) Prior Publication Data

US 2013/0341377 A1    Dec. 26, 2013

(51) Int. Cl.
*B23K 31/02* (2006.01)
*H01L 21/60* (2006.01)

(52) U.S. Cl.
USPC ....... 228/4.5; 228/1.1; 228/110.1; 228/180.5; 228/105; 134/22.1

(58) Field of Classification Search
USPC ............... 228/1.1, 4.5, 110.1, 180.5, 202, 228/103–105
See application file for complete search history.

(56) References Cited

U.S. PATENT DOCUMENTS 4,561,904 A * 12/1985 Eberhardt, Jr. .................. 134/18
7,857,190 B2 * 12/2010 Takahashi et al. ............ 228/102

FOREIGN PATENT DOCUMENTS

JP    07321143 A * 12/1995

OTHER PUBLICATIONS

JPO machine translation of JP 07321143 A, Dec. 8, 1995.*

* cited by examiner

*Primary Examiner* — Kevin P Kerns
*Assistant Examiner* — Kevin E Yoon
(74) *Attorney, Agent, or Firm* — Ostrolenk Faber LLP

(57) ABSTRACT

Disclosed is a wedge bonder, comprising a wedge for bonding a wire to surfaces to form an electrical interconnection therebetween, a cleaning device for cleaning the wedge, and a positioning device to which the wedge is mounted. In particular, the positioning device is operative to move the wedge to the cleaning device for cleaning. A method of cleaning a wedge of a wedge bonder is also disclosed.

20 Claims, 8 Drawing Sheets

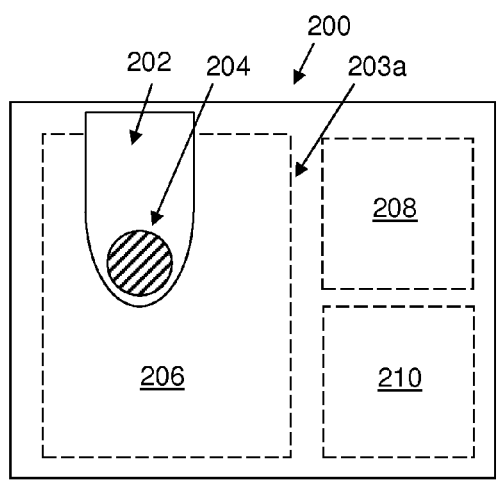
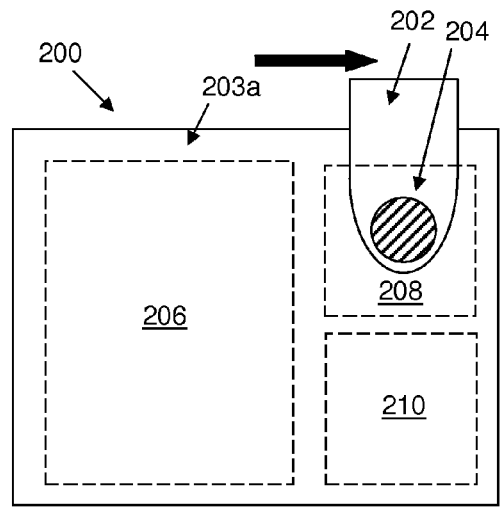
FIG. 2a     FIG. 2b
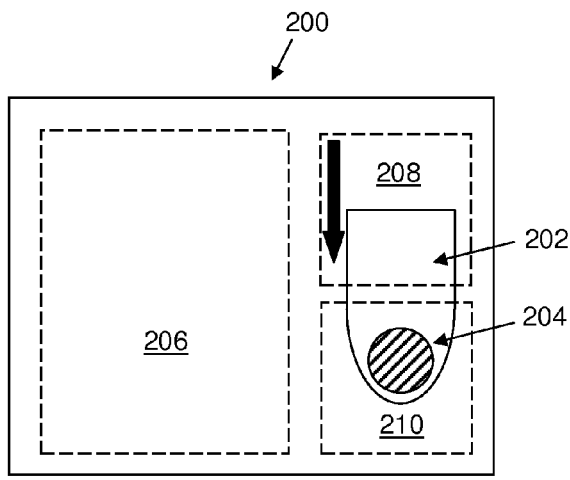
FIG. 2c
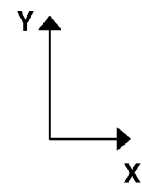

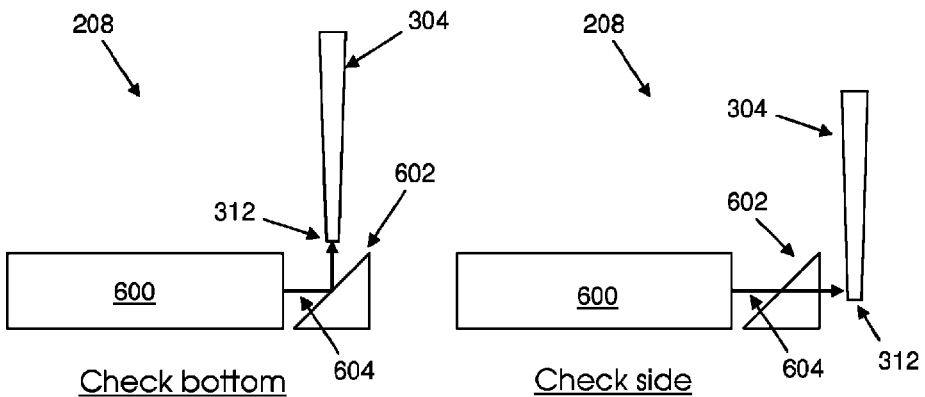
Check bottom  
FIG. 6a
Check side  
FIG. 6b
Used Wedge
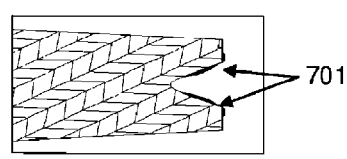
FIG. 7a
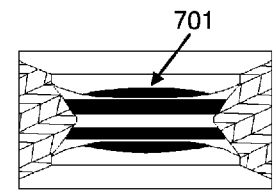
FIG. 7b
Cleaned Wedge
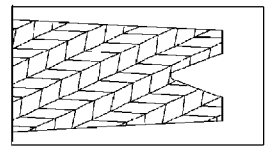
FIG. 7c
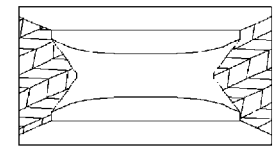
FIG. 7c

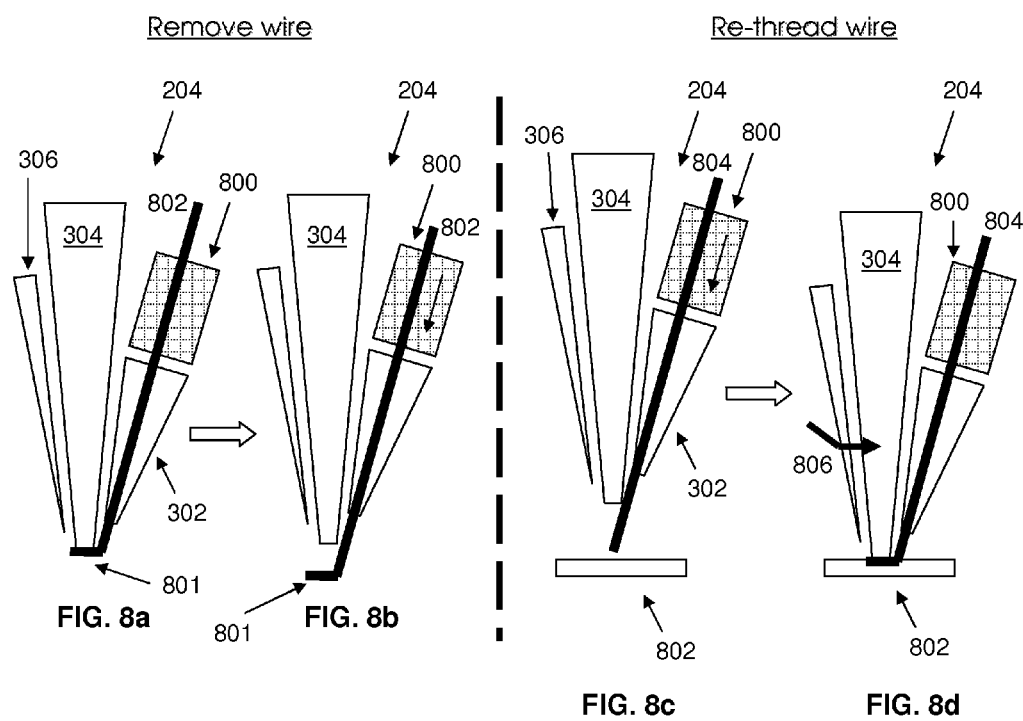

WEDGE BONDER AND A METHOD OF CLEANING A WEDGE BONDER

FIELD OF THE INVENTION

The present invention relates to a wedge bonder having a wedge for bonding a wire to surfaces to form an electrical interconnection therebetween. In particular, the wedge bonder further comprises a cleaning device for cleaning the wedge. The invention also relates to a method of cleaning a wedge of a wedge bonder.

BACKGROUND OF THE INVENTION

A wedge bonder utilizes ultrasonic energy to bond a wire to a semiconductor die and to a substrate to which the semiconductor die is mounted, so as to form an electrical interconnection between the semiconductor die and the substrate. Specifically, as the wedge presses the wire against a die pad of the semiconductor die or against the substrate, an ultrasonic transducer generates ultrasonic oscillations that are transmitted through a wedge of a bond tip of the wedge bonder and onward to the wire positioned beneath the wedge.

FIG. 1 shows a bond tip 100 of a conventional wedge bonder, comprising: i) a wire guide 102 for guiding a wire 104 from a wire spool (not shown) through the bond tip 100; ii) a wedge 106 having a bonding portion 108 for pressing a portion of the wire 104 against a bonding pad of a semiconductor die or against a substrate during bonding; and iii) a wire cutter 110 for cutting the wire 104 to detach the wire 104 from the wire spool after an electrical interconnection is formed between the semiconductor die and the substrate.

Repeated bonding operations of the wedge bonder will cause residue to build up at the bonding portion 108 of the wedge 106. For instance, Aluminum (Al) residue will build up at the bonding portion 108 of the wedge 106 if Al wire is used for wedge bonding. Hence, it will be necessary to clean the wedge 106. Conventionally, wedge cleaning involves removing the wedge 106 from the bond tip 100, and immersing the removed wedge 106 in a cleaning solution (e.g. NaOH solution) for about 30 minutes to remove the residue from the wedge 106. The wedge 106 is then reinstalled onto the bond tip 100 after cleaning, before the wedge bonder resumes its bonding operations.

However, reinstallation of the wedge 106 onto the bond tip 100 after cleaning requires set-up tasks such as recalibration of the ultrasonic transducer and fine component adjustment of the bond tip 100. These tasks are not just time-consuming but also require skilled technicians to undertake.

Thus, it is an object of the present invention to at least ameliorate the problems associated with cleaning the wedge of a wedge bonder.

SUMMARY OF THE INVENTION

A first aspect of the invention is a wedge bonder comprising a wedge for bonding a wire to surfaces to form an electrical interconnection therebetween, a cleaning device operative to clean the wedge, and a positioning device to which the wedge is mounted. In particular, the positioning device is operative to move the wedge to the cleaning device for cleaning.

A second aspect of the invention is a method of cleaning a wedge of a wedge bonder, the wedge being for bonding a wire to surfaces to form an electrical interconnection therebetween, and the wedge bonder further comprising a cleaning device for cleaning the wedge. Specifically, the method comprises the steps of moving the wedge to the cleaning device, and cleaning the wedge by the cleaning device.

BRIEF DESCRIPTION OF THE DRAWINGS

Embodiments of the invention will now be described, by way of example only, with reference to the accompanying drawings of which:

FIGS. 2a-2c show a wedge bonder of a preferred embodiment of the invention, comprising a bonding zone, an imaging zone, and a cleaning zone;

FIG. 6a and FIG. 6b show the imaging device of the wedge bonder of FIG. 2, comprising a camera and a beam-splitter;

FIGS. 7a-7b show respective side and bottom views of the wedge of the wedge bonder of FIG. 2 as captured by the imaging device of FIGS. 6a-6b before cleaning, while FIGS. 7c-7d show respective side and bottom views of the wedge of the wedge bonder of FIG. 2 as captured by the imaging device of FIGS. 6a-6b after cleaning;

FIGS. 8a-8d show the bond tip of the wedge bonder of FIG. 2, further comprising a wire-feeding mechanism for removing a wire from the bond tip before wedge cleaning and for introducing a new wire into the bond tip after wedge cleaning.

DETAILED DESCRIPTION OF THE PREFERRED EMBODIMENTS

Figure 1:
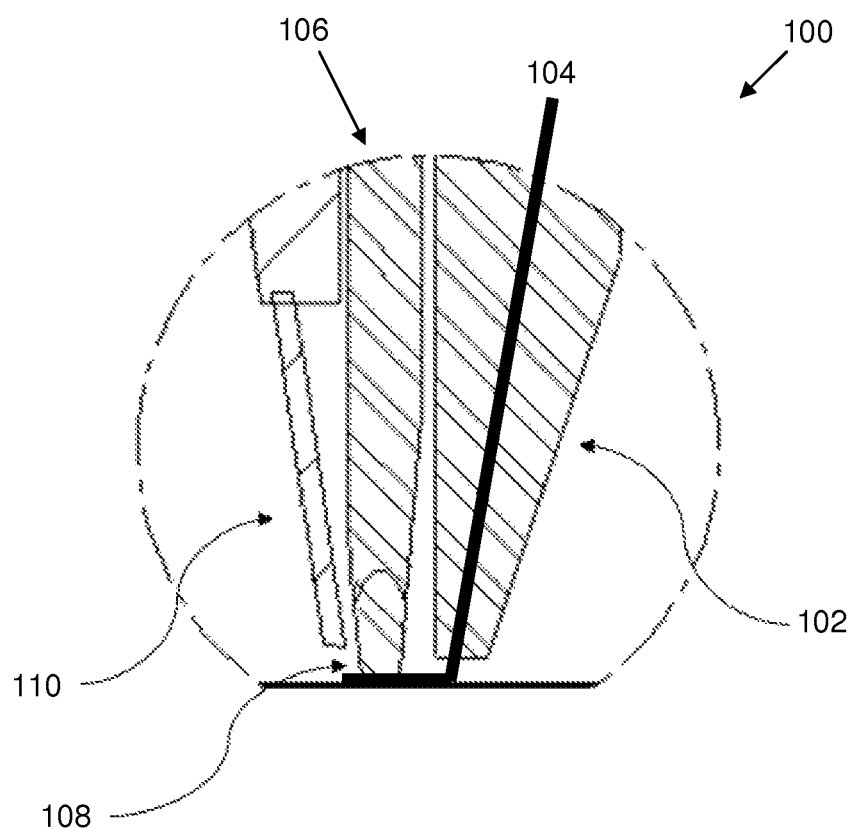
FIG. 1 shows a conventional bond tip of a wedge bonder.

FIG. 2a-2c are plan views of a wedge bonder 200, showing a positioning device (illustrated by an XY-table 202) and a bond tip 204 mounted to the XY-table 202. Similarly to the bond tip shown in FIG. 1, the bond tip 204 may comprise: i) a wire guide for guiding a wire from a wire spool through the bond tip 204; ii) a wedge having a bonding portion for pressing a portion of the wire against a bonding pad of a semiconductor die or against a substrate during bonding; and iii) a wire cutter for cutting the wire to detach the wire from the wire spool after an electrical interconnection is formed between the semiconductor die and the substrate.

In addition, the wedge bonder 200 comprises: i) a bonding zone 206 for supporting a substrate (e.g. a lead frame) when performing bonding operations; ii) an imaging zone 208 for inspecting the wedge; and iii) a cleaning zone 210 for cleaning the wedge.

Specifically, actuation of the XY-table 202 is controlled by a motion controller and a motor system comprising linear motors. FIG. 2a illustrates the bond tip 204 positioned by the XY-table 202 relative to and above the bonding zone 206. In particular, the XY-table 202 actuates the bond tip 204 to move from an original start position at the left of the bonding zone 206 rightward along an X-direction to bond a row of semiconductor dies to the substrate. Thereafter, the substrate is then indexed upward along the V-direction while the XY-table 202 actuates the bond tip 204 leftward along the X-direction to reposition the bond tip 204 back to its original start position before bonding another row of semiconductor dies to the substrate. FIG. 2b illustrates the bond tip 204 being actuated to move rightward along the X-direction by the XY-table 202 to a position relative to and above the imaging zone 208, while FIG. 2c illustrates the bond tip 204 being actuated to move downward along the Y-direction by the XY-table 202 to a position relative to and above the cleaning zone 210.

Figure 3:
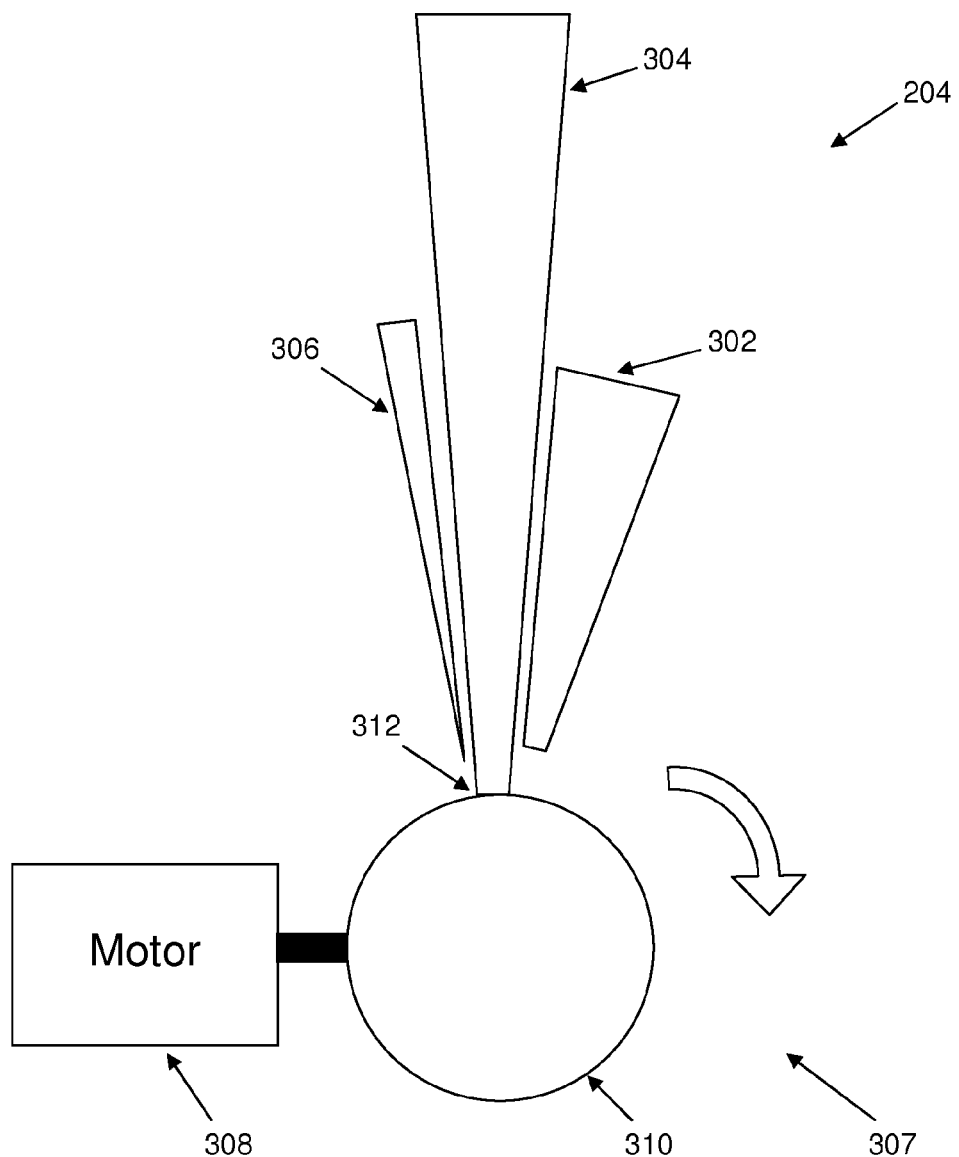
FIG. 3 shows a configuration of the cleaning device of the wedge bonder of FIG. 2, comprising a rotatable cleaning wheel for cleaning the wedge.

FIG. 3 illustrates the bond tip 204 having the wire guide 302, the wedge 304, and the wire cutter 306, together with a cleaning device 307 of the cleaning zone 210 of the wedge bonder 200 that cleans the wedge 304 using a dry approach. This cleaning device 307 of the cleaning zone 210 comprises: i) a motor 308; and ii) a rotary cleaning wheel (shown as a rotatable grinding wheel 310) coupled to the motor 308. The motor 308 is controlled by a motion controller to drive the grinding wheel 310 at a controlled speed against a bonding portion 312 of the wedge 304, to remove residue (e.g. Al residue) mechanically therefrom.

Optionally, the geometry of the grinding wheel 310 may vary based on the corresponding geometry of the bonding portion 312 of the wedge 304.

Figures 4A, 4B:
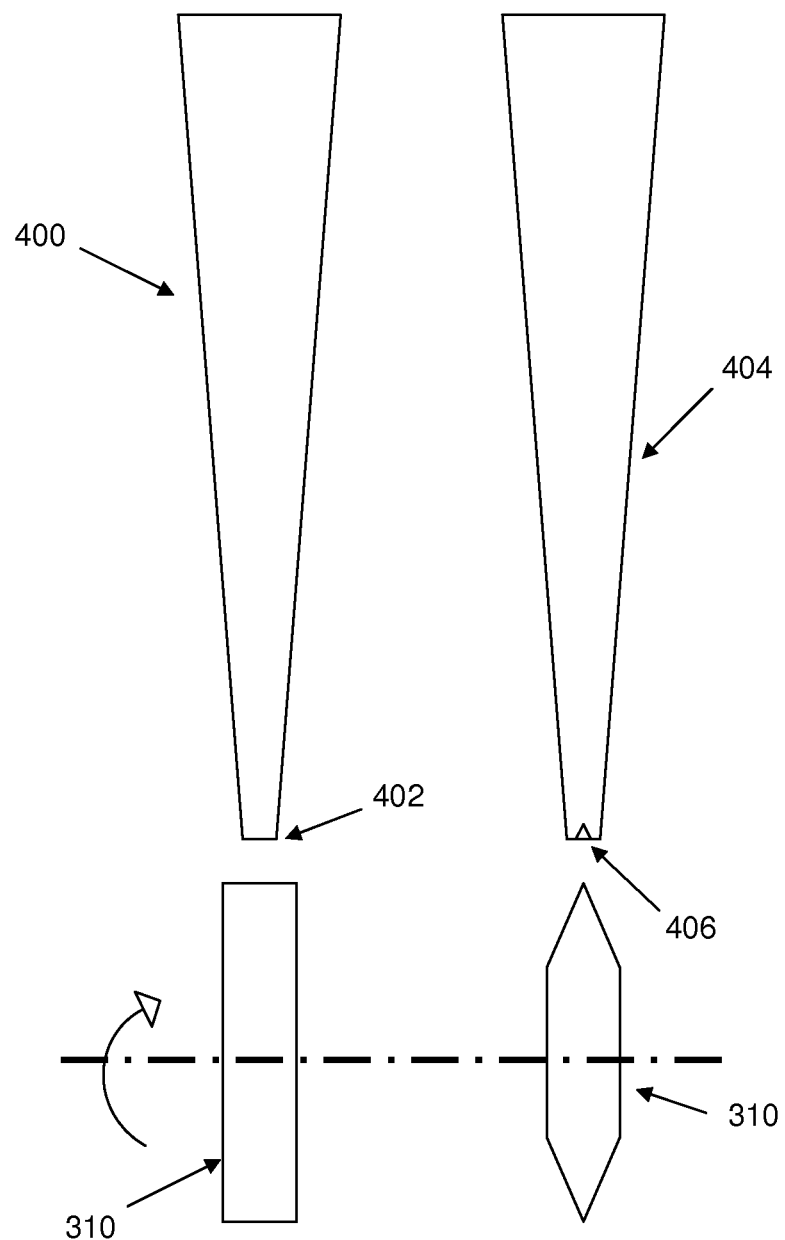
FIG. 4a and FIG. 4b show different geometries of the rotatable cleaning wheel of FIG. 3 for cleaning the wedge.

For instance, FIG. 4a illustrates a configuration of a wedge 400 having a flat-end bonding portion 402 for pushing a ribbon wire against a semiconductor die or a substrate during bonding. For such a configuration of the wedge 400, the corresponding geometry of the grinding wheel 310 may comprise corresponding flat ends when viewed in a direction perpendicular to its rotational axis or to its major surface. On the other hand, FIG. 4b illustrates a configuration of a wedge 404 having a bonding tip that includes a V-shaped groove 406 for at least partially housing and pushing a round wire against a semiconductor die or a substrate during bonding. In this embodiment of the wedge 404, the corresponding geometry of the grinding wheel 310 may comprise tapered ends when viewed in a direction perpendicular to its rotational axis or to its major surface.

Of course, it should be appreciated that other geometries of the grinding wheel 310 may also be possible to match corresponding geometries of the wedge 404 for the purpose of cleaning. For instance, the grinding wheel 310 may comprises trapezoidal ends when viewed in a direction perpendicular to its rotational axis or to its major surface for cleaning a corresponding U-shaped groove of a wedge-bonding tip.

Besides the dry approach for cleaning the wedge 304 as described above, the wedge 304 may instead be cleaned at the cleaning zone 210 of the wedge bonder 200 using a wet approach.

Figure 5:
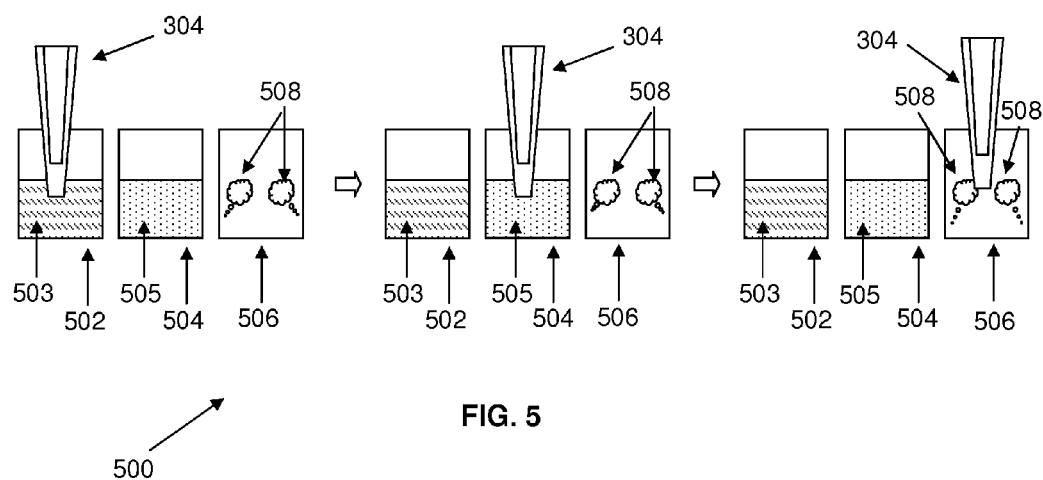
FIG. 5 shows another configuration of the cleaning device of the wedge bonder of FIG. 2, comprising a plurality of chambers used for wedge cleaning.

FIG. 5 illustrates a configuration 500 of the cleaning zone 210 based on the wet approach. Such a configuration 500 comprises three chambers 502, 504, 506—i) a first chamber 502 for storing a cleaning solution 503 (e.g. NaOH solution) for removing residue (e.g. Al residue); ii) a second chamber 504 for storing a rinsing solution 505 (e.g. $H_2O$); and iii) a third chamber 506 for housing a dryer 508 for drying. Specifically, the XY-table 202 of the wedge bonder 200 first positions the bond tip 204 relative to and above the first chamber 502 of the cleaning zone 210, before immersing the bonding portion 312 of the wedge 304 into the cleaning solution 503 to remove residue from the wedge 304. After the bonding portion 312 of the wedge 304 has been immersed in the cleaning solution 503 for a sufficient period of time, the XY-table 202 of the wedge bonder 200 withdraws the wedge 304 from the cleaning solution 503, before immersing the same into the rinsing solution 505 to remove the cleaning solution 503 from the wedge 304 for another period of time as required. The XY-table 202 of the wedge bonder 200 then withdraws the wedge 304 from the rinsing solution 505, before moving the wedge 304 into the third chamber 506 for drying the same. This completes the wedge-cleaning process based on the wet approach.

Preferably, the first and second chambers 502, 504 are deep enough to store the respective cleaning and rinsing solutions 503, 505 to avoid spillage within the wedge bonder 200 during operation.

FIG. 6a and FIG. 6b illustrate the imaging zone 208 of the wedge bonder 200, comprising an imaging device for capturing an image of the bonding portion 312 of the wedge 304. Specifically, the imaging device comprises a beam-splitter 602 and a camera 600 positioned with respect to the beam-splitter 602 for capturing different images of the wedge 304. When the wedge 304 is arranged perpendicularly to a line-of-view 604 of the camera 600 above the beam-splitter 602 as shown in FIG. 6a, the beam-splitter 602 allows the camera 600 to capture an image of a base of the bonding portion 312. When the wedge 304 is aligned along the line-of-view 604 of the camera 600 such that the beam-splitter 602 is positioned between the camera 600 and the bonding portion 312 as shown in FIG. 6b, the beam-splitter 602 allows the camera 600 to capture an image of a side of the bonding portion 312.

FIG. 7a and FIG. 7b respectively illustrate a sample side image and a sample bottom image of the bonding portion 312 of the wedge 304 as captured by the imaging device before cleaning. It can be seen that the residue 701 (e.g. Al residue) accumulates at the inner walls of the wedge-bonding portion 312 after repeated bonding operations (e.g. 3000 bonding cycles). FIG. 7c and FIG. 7d respectively illustrate a sample side image and a sample bottom image of the bonding portion 312 of the wedge 304 after cleaning. It can be seen that the residue (e.g. Al residue) that previously accumulated at the inner walls of the wedge-bonding portion 312 has been removed.

FIGS. 8a-8d show that the bond tip 204 of the wedge bonder 200 additionally comprises a wire-feeding mechanism 800 for removing a wire 802 from the bond tip 204 before the wedge-cleaning process begins, and for introducing a new wire 804 through the bond tip 204 after the wedge-cleaning process ends. The wire-feeding mechanism 800 may include a set of friction wheels or wire clamps for the wire-removal and wire-rethreading processes.

Specifically, FIGS. 8a and 8b show a kinked portion 801 of the wire 802 being pushed away from the bonding portion 312 by the wire-feeding mechanism 800, in order to dislodge the wire 802 from a groove of the bonding portion 312. Thereafter, the wire-feeding mechanism 800 retracts the wire 802 from the bond tip 204 to remove the wire 802 therefrom.

FIGS. 8c and 8d show the new wire 804 being re-threaded through the bond tip 204 until the wire 804 feeds out from the wire guide 302. Thereafter, the bond tip 204 moves downwards and backwards (as shown by arrow 806) during a dummy-bonding process, so that the wedge 304 pushes the new wire 804 against a dummy bond-off plate 802. Following the dummy-bonding process, the new wire 804 is then firmly captured by the bonding portion 312 and thus, the wedge bonder 200 is able to continue its bonding operations.

Figure 9:
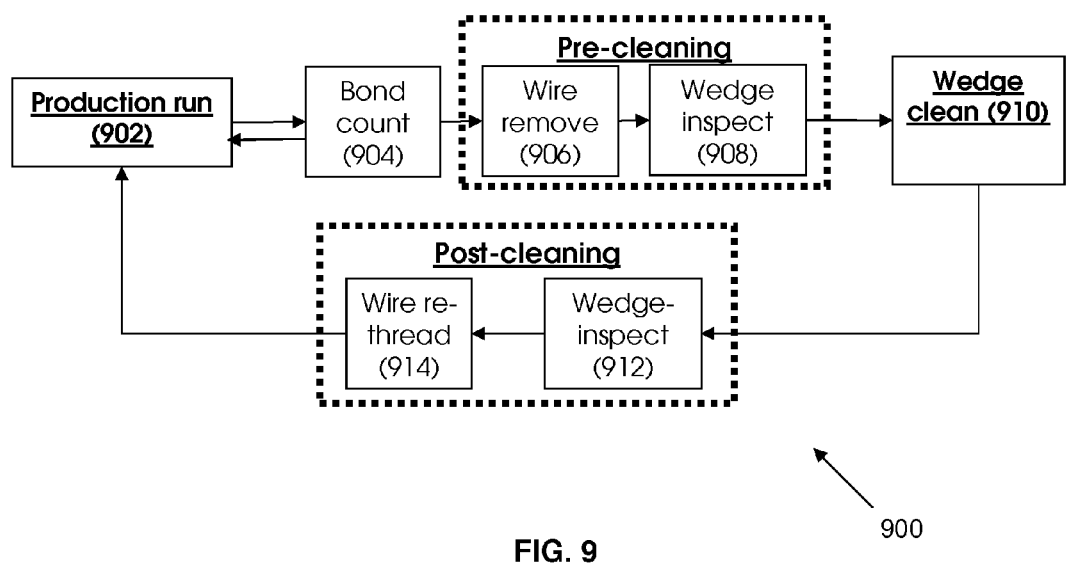
FIG. 9 is a flow chart showing a wedge-cleaning process performed by the wedge bonder of FIG. 2.

FIG. 9 is a flow chart 900 showing a wedge-cleaning process on the wedge bonder 200.

The flow chart 900 first begins with the step 902 of wedge bonding followed by the step 904 of incrementing a bond counter by one. Iterations of the step 902 of wedge bonding and the step 904 of incrementing the bond counter continue until the bond counter registers a count number (e.g. 3000) to trigger the cleaning of the wedge 304. The wedge bonder 200 then switches to a "pre-cleaning" mode.

During this pre-cleaning mode, the wedge bonder 200 performs the step 906 of removing the wire from the bond tip 204. The wire-feeding mechanism 800 of the bond tip 204 actuates to remove the wire from the bond tip 204. In particular, the kinked portion of the wire is pushed away from the bonding portion 312 of the wedge 304, in order to dislodge the wire 802 from the groove of the bonding portion 312. The wire-feeding mechanism 800 then retracts the wire from the bond tip 204 to remove the wire therefrom.

After the step 906 of removing the wire from the bond tip 204, the wedge bonder 200 then performs the step 908 of inspecting the bonding portion 312 during which the wedge 304 is moved to the imaging zone 208. Thereafter, the wedge bonder 200 performs the step 910 of cleaning the bonding portion 312 in which the wedge 304 is moved to the cleaning zone 210. Subsequently, the wedge bonder 200 switches into a "post-cleaning" mode.

During this post-cleaning mode, the wedge bonder 200 again performs the step 912 of inspecting the bonding portion 312 in which the wedge is moved to the imaging zone 208. Thereafter, the wedge bonder 200 performs the step 914 of re-threading a new wire through the bond tip 204, before the wedge bonder 200 resumes its bonding operations.

This completes an iteration of the wedge-cleaning process on the wedge bonder 200. Such an iteration of the wedge-cleaning process may be performed either automatically or manually. Indeed, any or all of the steps of the wedge-cleaning process may be performed either automatically or manually.

Optionally, the imaging device may provide feedback for the wedge-cleaning process. For instance, if no residue is detected from the sample images of the bonding portion 312 as captured by the imaging device during the pre-cleaning mode, the wedge bonder may bypass the wedge-cleaning process to resume its bonding operations. Likewise, if some residue is detected from the sample images of the bonding portion 312 as captured by the imaging device after the wedge-cleaning process, the wedge bonder may operate to reposition the wedge 304 relative to the cleaning zone 210 for another round of cleaning. If the sample images of the bonding portion 312 otherwise show that the wedge 304 has been sufficiently cleaned, the wedge bonder 200 then performs the step 914 of wire re-threading before resuming its bonding operations.

Since there is no need to dismantle the wedge 304 from the bond tip 204 for cleaning and to reinstall the dismantled wedge 304 back to the bond tip 204 after cleaning, the wedge-cleaning process advantageously reduces maintenance time and reliance on skilled technicians for set-up tasks such as recalibration of the ultrasonic transducer and fine component adjustment of the bond tip 204. Furthermore, by automating the wedge-cleaning process, a reasonable wedge-cleaning quality could be expected without human intervention.

It should be appreciated that other embodiments of the present invention can be envisaged without departing from the scope of the invention. For instance, although it has been described that the imaging and cleaning zones 208, 210 comprises the imaging and cleaning devices respectively, it can be envisaged that these devices do not have to be permanently positioned at their respective imaging and cleaning zones 208, 210. Instead, each of these devices could be moved by an actuator into its respective zone 208, 210 to perform the necessary operations. Furthermore, the imaging zone 208 and the corresponding imaging device are optional and may thus be omitted.

The invention claimed is:

1. A wedge bonder comprising:
a wedge for bonding a wire to surfaces to form an electrical interconnection therebetween;
a cleaning device operative to clean the wedge;
a positioning device to which the wedge is mounted, the positioning device being operative to move the wedge to the cleaning device for cleaning; and
an imaging device operative to capture an image of a bonding portion of the wedge,
wherein:
the imaging device comprises a camera and a beam-splitter,
the positioning device is operative to move the wedge to a first position relative to the beam splitter to allow the camera to produce an image of a bottom view of the bonding portion of the wedge, and to a second position relative to the beam splitter to allow the camera to produce an image of a side view of the bonding portion of the wedge, and
the bonding portion of the wedge at the first position is positioned above the beam-splitter and perpendicularly to a line-of-view of the camera, to allow the camera to produce the image of the bottom view of the bonding portion of the wedge.

2. The wedge bonder of claim 1, wherein the cleaning device is operative to clean the wedge automatically.

3. The wedge bonder of claim 1, wherein the cleaning device comprises a cleaning chamber for storing a cleaning solution, and the positioning device is operative to move the wedge to immerse a bonding portion of the wedge into the cleaning solution.

4. The wedge bonder of claim 3, wherein the cleaning device further comprises a rinsing chamber for storing a rinsing solution, and the positioning device is operative to move the wedge to immerse the bonding portion of the wedge into the rinsing solution.

5. The wedge bonder of claim 4, wherein the cleaning device further comprises a dryer for drying the bonding portion of the wedge, and the positioning device is operative to move the wedge relative to the dryer for drying the bonding portion of the wedge.

6. The wedge bonder of claim 1, further comprising a wire feeder operative to remove the wire from the wedge.

7. The wedge bonder of claim 6, wherein the wire feeder is operative to introduce a new wire to the wedge.

8. A method of cleaning a wedge of the wedge bonder of claim 1, comprising the steps of:
moving the wedge to a position in relation to the cleaning device; and
cleaning the wedge using the cleaning device.

9. The method of claim 8, wherein the step of cleaning the wedge using the cleaning device is performed automatically.

10. The method of claim 8, further comprising the steps of:
positioning the wedge at the first position relative to the beam splitter to allow the camera to produce the image of the bottom view of the bonding portion of the wedge; and
positioning the wedge at the second position relative to the beam splitter to allow the camera to produce the image of the side view of the bonding portion of the wedge.

11. The method of claim 10, wherein the step of positioning the wedge at the first position relative to the beam-splitter comprises positioning the bonding portion of the wedge above the beam-splitter and perpendicularly to the line-of-view of the camera, to allow the camera to produce the image of the bottom view of the bonding portion of the wedge.

12. A wedge bonder comprising:
- a wedge for bonding a wire to surfaces to form an electrical interconnection therebetween;
- a cleaning device operative to clean the wedge;
- a positioning device to which the wedge is mounted, the positioning device being operative to move the wedge to the cleaning device for cleaning; and
- an imaging device operative to capture an image of a bonding portion of the wedge, wherein:
- the imaging device comprises a camera and a beam-splitter,
- the positioning device is operative to move the wedge to a first position relative to the beam splitter to allow the camera to produce an image of a bottom view of the bonding portion of the wedge, and to a second position relative to the beam splitter to allow the camera to produce an image of a side view of the bonding portion of the wedge, and
- the bonding portion of the wedge at the second position is aligned along a line-of-view of the camera such that the beam-splitter is positioned between the camera and the bonding portion of the wedge, to allow the camera to produce the image of the side view of the bonding portion of the wedge.

13. A method of cleaning a wedge of the wedge bonder of claim 12 comprising the steps of:
- moving the wedge to a position in relation to the cleaning device; and
- cleaning the wedge using the cleaning device.

14. The method of claim 13, wherein the step of cleaning the wedge using the cleaning device is performed automatically.

15. The method of claim 13, further comprising the steps of:
- positioning the wedge at the first position relative to the beam splitter to allow the camera to produce the image of the bottom view of the bonding portion of the wedge; and
- positioning the wedge at the second position relative to the beam splitter to allow the camera to produce the image of the side view of the bonding portion of the wedge.

16. The method of claim 15, wherein the step of positioning the wedge at the second position relative to the beam-splitter comprises aligning the bonding portion of the wedge along the line-of-view of the camera such that the beam-splitter is positioned between the camera and the bonding portion of the wedge, to allow the camera to produce the image of the side view of the bonding portion of the wedge.

17. The wedge bonder of claim 12, wherein the cleaning device is operative to clean the wedge automatically.

18. The wedge bonder of claim 12, wherein the cleaning device comprises a cleaning chamber for storing a cleaning solution, and the positioning device is operative to move the wedge to immerse a bonding portion of the wedge into the cleaning solution.

19. The wedge bonder of claim 12, further comprising a wire feeder operative to remove the wire from the wedge.

20. The wedge bonder of claim 19, wherein the wire feeder is operative to introduce a new wire to the wedge.

* * * * *